(12) United States Patent
Scheid

(10) Patent No.: US 7,067,352 B1
(45) Date of Patent: Jun. 27, 2006

(54) VERTICAL INTEGRATED PACKAGE APPARATUS AND METHOD

(76) Inventor: David Ralph Scheid, 3873 Gunnes Rd., Eau Claire, WI (US) 54701

( * ) Notice: Subject to any disclaimer, the term of this patent is extended or adjusted under 35 U.S.C. 154(b) by 93 days.

(21) Appl. No.: 10/796,887

(22) Filed: Mar. 8, 2004

(51) Int. Cl.
H01L 21/50 (2006.01)
H01L 21/48 (2006.01)
H01L 21/44 (2006.01)

(52) U.S. Cl. ............. 438/109; 438/457; 438/458; 438/459

(58) Field of Classification Search ........ 438/107–111, 438/455, 457, 458, 459
See application file for complete search history.

(56) References Cited

U.S. PATENT DOCUMENTS

| | | | |
|---|---|---|---|
| 4,783,695 A | | 11/1988 | Eichelberger |
| 5,345,205 A | * | 9/1994 | Kornrumpf .............. 333/246 |
| 5,448,511 A | * | 9/1995 | Paurus et al. .............. 365/52 |
| 5,452,182 A | * | 9/1995 | Eichelberger et al. ...... 361/749 |
| 5,776,797 A | * | 7/1998 | Nicewarner et al. ........ 438/107 |
| 6,699,730 B1 | | 3/2004 | Kim |

\* cited by examiner

*Primary Examiner*—Zandra V. Smith
*Assistant Examiner*—Khanh Duong
(74) *Attorney, Agent, or Firm*—Anthony J. Bourget

(57) ABSTRACT

A method of fabricating integrated circuits from a plurality of semiconductor dice, each semiconductor die defining a top side and a bottom side, includes the steps of attaching the bottom sides of the plurality of semiconductor dice to a substrate so that the plurality of semiconductor dice are in adjacent disposition and define one or more bending regions; creating a thin film interconnect on the top sides of the plurality of semiconductor dice and over one or more die gap regions so that the plurality of semiconductor dice are electrically interconnected; removing the substrate from the bottom sides of the plurality of semiconductor dice; and bending the thin film interconnect at the one or more die gap regions so that the bottom sides and the top sides of the semiconductor dice overlap to form a stacked plurality of semiconductor dice.

18 Claims, 16 Drawing Sheets

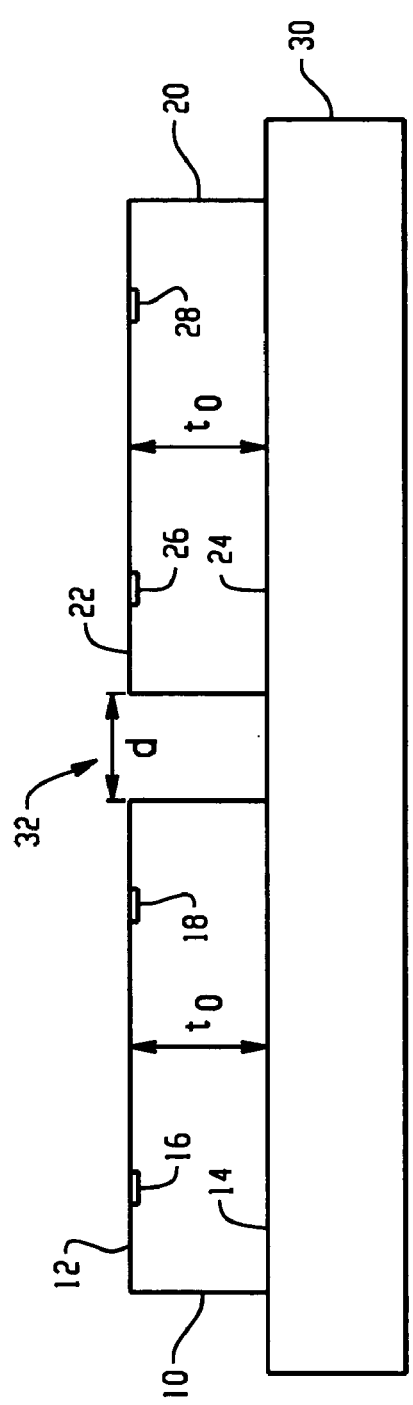
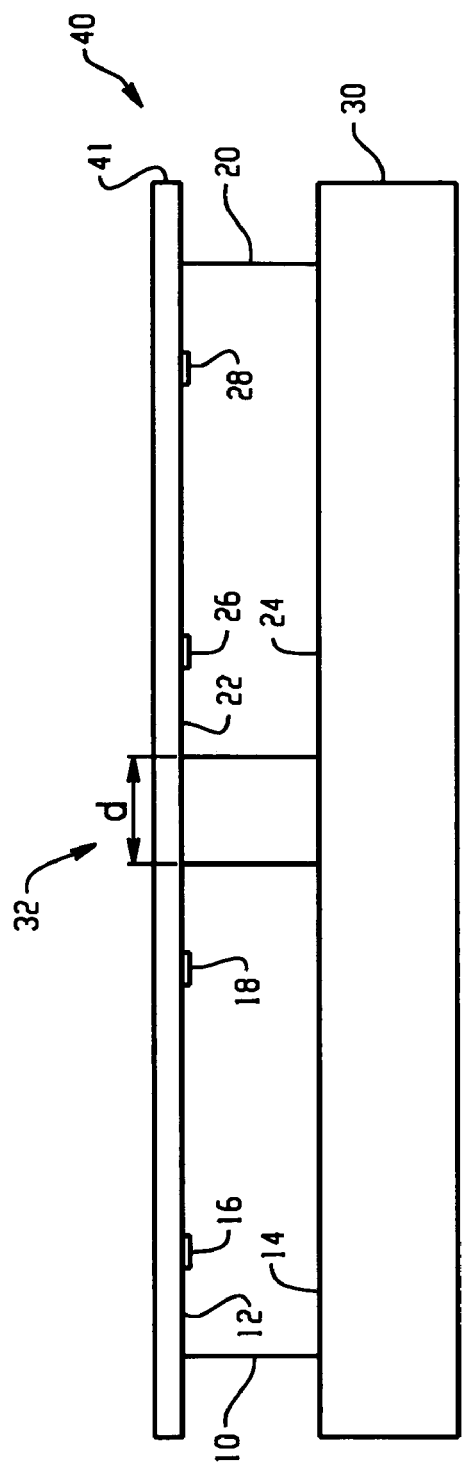

US 7,067,352 B1

VERTICAL INTEGRATED PACKAGE APPARATUS AND METHOD

BACKGROUND

1. Technical Field

This invention relates to the field of semiconductor packaging, and more particularly to three-dimensional packaging of two or more semiconductor dice.

2. Description of the Related Art

Semiconductor devices may be arranged in an overlaying manner to form a vertically stacked integrated circuit assembly. Arranging semiconductor devices in this manner typically increases the silicon efficiency (e.g., the efficient utilization of silicon real estate), and requires shorter interconnection lengths between the semiconductor devices, which, in turn, reduces the time required for a signal to travel between the semiconductor devices. The shorter interconnection lengths also reduce parasitic capacitance and power consumption, which, in turn, reduces unwanted noise.

Typically, a stacked integrated circuit may be formed by placing semiconductor devices in a vertical arrangement and then providing vertical interconnections to route power, ground, and signals for the semiconductor devices. The vertical interconnections may be provided by periphery interconnections between the stacked semiconductor devices, or by area interconnections between the stacked semiconductor devices.

One type of periphery interconnection is realized by a folding flex circuit. In a folding flex circuit, semiconductor dice are mounted and bonded to the flex circuit, and then folded to form a vertically stacked integrated circuit.

SUMMARY

According to a method of fabricating integrated circuits from a plurality of semiconductor dice, each semiconductor die defining a top side and a bottom side, the bottom sides of the plurality of semiconductor dice are attached to a substrate so that the plurality of semiconductor dice are in adjacent disposition and define one or more bending regions. A dielectric lamination is then accomplished over the top sides of the die to provide a planar processing surface over the die array and the die gaps. Thin film interconnect is created on the top sides of the plurality of semiconductor dice by patterning and etching subsequent dielectric and conductor layers so that the plurality of semiconductor dice are electrically interconnected across one or more bending regions. The substrate is removed from the bottom sides of the plurality of semiconductor dice. The thin film interconnect is bent at the one or more of the die gap regions so that the semiconductor dice overlap to form a stacked plurality of semiconductor dice.

According to another method of fabricating an integrated circuit, a plurality of semiconductor dice are adjacently positioned. Each of the plurality of semiconductor dice has a top side and a bottom side. The top sides define the active circuit and after lamination a planar surface for subsequent interconnect. A bending region is defined by at least two of the plurality of semiconductor dice. A flexible thin film member is created on the top sides of the plurality of semiconductor dice and across the die gap region. Flexible electrical interconnections are thus created to electrically connect the plurality of semiconductor dice. The flexible member is folded or bent to the proper angle at this die gap region so that the semiconductor dice form a multidimensional interconnected dice structure.

A vertical integrated package comprises a plurality of semiconductor dice and a flexible thin film interconnect. The plurality of semiconductor dice arranged in an overlapping relationship to form a vertical die stack or simply bent at an angle to form a three dimensional element. The top sides of each semiconductor die includes the electrically conductive terminals. The flexible thin film interconnect is connected to the top sides of the plurality of semiconductor dice and comprises a plurality of flexible electrical interconnections to provide the conduction paths to the plurality of semiconductor dice. The flexible thin film interconnect is bent within the region defined by a pair of adjacently connected die.

BRIEF DESCRIPTION OF THE DRAWINGS

FIG. 1 is a cross sectional view of a plurality of semiconductor dice attached to a substrate;

FIG. 2 is a cross sectional view of the semiconductor dice having a flexible dielectric member attached to top sides of the semiconductor dice;

DETAILED DESCRIPTION

An exemplary method of fabricating a stacked plurality of semiconductor dice typically includes the steps of creating a flexible dielectric planar surface on the top sides of the dice, creating flexible electrical interconnections on top of this dielectric to electrically connect the plurality of semiconductor dice, and then bending these interconnections so that the plurality of semiconductor dice overlap to form a stacked plurality of semiconductor dice.

Figure 18:
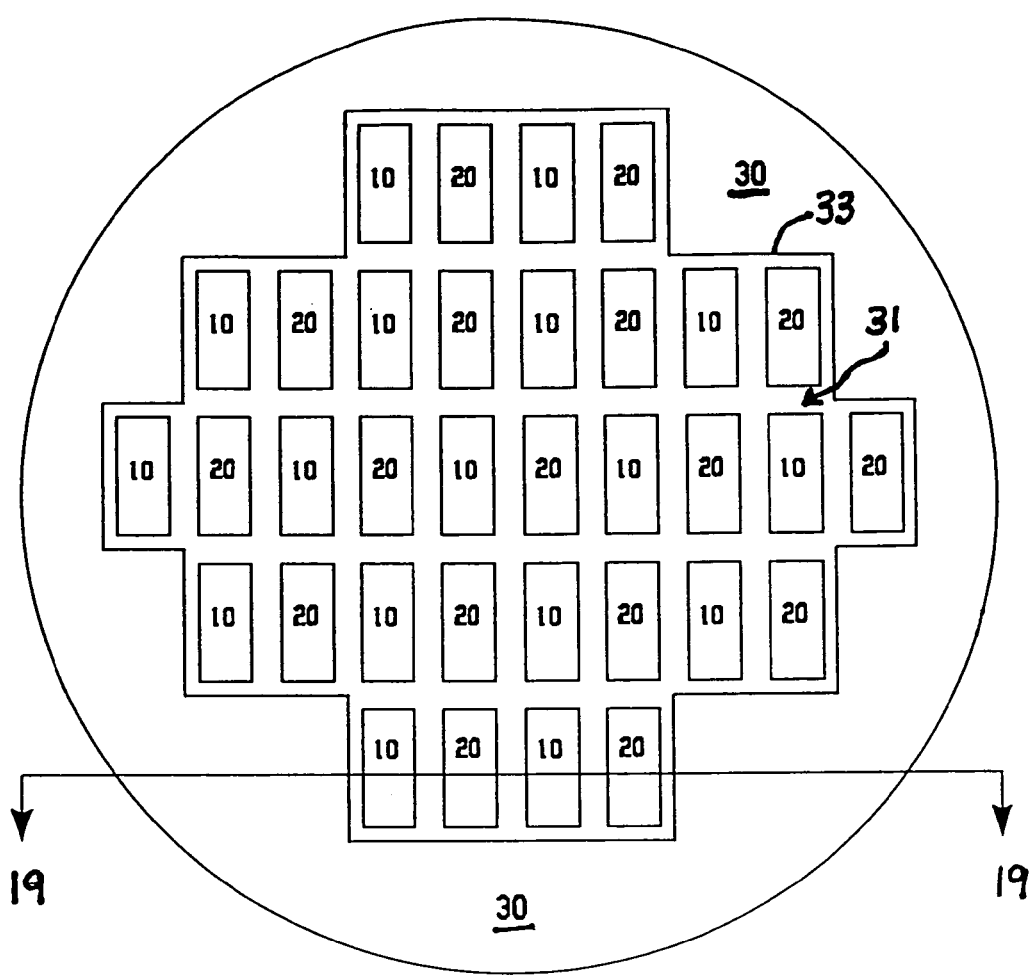
FIG. 18 is a top view of a plurality of semiconductor dice attached within a large substrate pocket of a cavity substrate.
Figure 19:
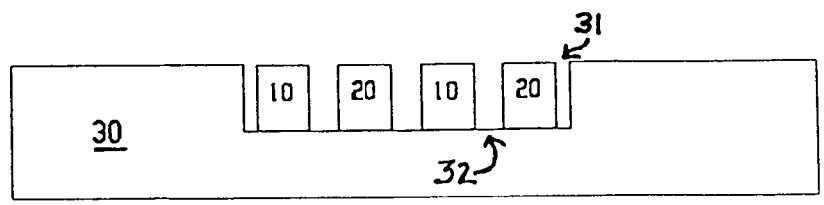
FIG. 19 is a cross section view taken along line 19—19 of FIG. 18.

FIGS. 1–5A, 6 and 7 depict a plurality of semiconductor dice 10 and 20 at various times during an exemplary fabrication process. In particular, FIG. 1 is a cross section view of a plurality of semiconductor dice 10 and 20. The dice 10 and 20 are typically semiconductor dice resulting from the singulation of a semiconductor wafer, and have a thickness of $t_0$ between 12 and 30 mils which corresponds to the full thickness of the semiconductor wafer. Retaining the die thickness $t_0$ above 12 mils for the semiconductor dice 10 and 20 helps to reduce breakage of the semiconductor dice 10 and 20 during handling steps. These dice 10 and 20 plus others are arrayed on a coefficient of thermal expansion (CTE) matched substrate which is typically a silicon cavity wafer with the appropriate pocket depth to match the thickness of die 10 and 20. These die placements are done automatically with a pick and place unit equipped with a pattern recognition system so that the die are placed with an accuracy of better than 10 microns and bonded to the substrate. FIG. 18 is a top view of a plurality of semiconductor dice 10, 20, attached within a large substrate pocket 31 of a cavity substrate 30 (pocket 31 having perimeter depicted generally at perimeter 33). FIG. 19 is a cross section view taken along line 19—19 of FIG. 18.

Each of the dice 10 and 20 define top sides 12 and 22, respectively, and bottom sides 14 and 24, respectively. The top sides 12 and 22 of the semiconductor dice 10 and 20 comprise integrated circuitry constructed by one of many known methods. For example, the integrated circuitry may be constructed on a bare wafer by film deposition, lithography and masking, etching, and implanting and diffusion techniques. The individual dice 10 and 12 are then separated from the wafer by a singulation process from the finished wafer.

Die pads 16 and 18 provide electrical connections for the integrated circuitry on the top side 12 of the semiconductor die 10. Likewise, die pads 26 and 28 provide electrical connections for the integrated circuitry on the top side 22 of the semiconductor die 20. A semiconductor die typically has many die pads; however, to avoid congestion in the drawings, only two die pads are shown for each semiconductor die 10 and 20.

The semiconductor dice 10 and 20 are attached to a substrate 30 to facilitate further processing. The bottom sides of the semiconductor dice 10 and 20 are attached to the substrate 30 so that the semiconductor dice 10 and 20 are in adjacent disposition and define a die gap 32. The die gap 32 has a gap length d, the magnitude of which is determined by a folding or bending process described with reference to FIGS. 6 and 7 below.

Typically, the substrate 30 comprises a material having the same or similar coefficient of thermal expansion (CTE) as the semiconductor dice 10 and 20. In one embodiment, the substrate 30 comprises the same semiconductor material as that which is used to make the semiconductor dice 10 and 20. For example, if the semiconductor dice 10 and 20 are made from silicon, then the substrate 30 comprises a silicon substrate. Other materials may also be used for the substrate 30, such as Invar, quartz, or graphite, for example, depending on stress tolerance requirements.

By selecting a substrate 30 having the same or similar CTE as the semiconductor dice 10 and 20, the interface stress due to temperature changes during subsequent thin film processing described with reference to FIGS. 2–7 is minimized.

The semiconductor dice 10 and 20 are typically attached to the substrate 30 by an adhesive, such as one of many die-bonding pastes known in the art. The semiconductor dice 10 and 20 may also be attached by die bonding film. Other methods of attaching the semiconductor dice 10 and 20 to the substrate 30 may also be used.

After the semiconductor dice 10 and 20 are attached to the substrate 30, further processing may now be done at the substrate 30 level for which a wide selection of wafer processing equipment is available. Processing at the substrate 30 level also helps reduce breakage of the semiconductor dice 10 and 20.

FIG. 2 is a cross section view of the semiconductor dice 10 and 20 having a flexible member 40 attached to the top sides 12 and 22 of the semiconductor dice 10 and 20. The flexible member 40 is typically attached after the semiconductor dice 10 and 20 have been bonded to the substrate 30. Typically, the flexible member 40 comprises a material that may be used as a passivation coating, or as an interlevel dielectric layer. In one embodiment, the flexible material 40 comprises a polyimide material. Other flexible materials may also be used, such as a liquid crystal polymer (LCP) material. The material used need only be flexible enough to facilitate bending in the folding region defined by the die gap 32, and also be capable of withstanding the processing temperatures and chemicals used in the subsequent thin film fabrication process.

In one embodiment, the flexible material 40 comprises a layer 41 that is laminated in an autoclave under pressure and temperature to the top sides 12 and 22 of the semiconductor dice 10 and 20. After lamination, the flexible member 40 provides a planar surface for subsequent thin film processing, and extends across the die gap 32. Other methods of creating a flexible member 40 on the first sides 12 and 22 of the semiconductor dice 10 and 20 and across the die gap 32 may also be used. Flexible electrical interconnections may now be created on top of member 40 to electrically connect the semiconductor dice 10 and 20.

While the flexible member 40 shown in FIG. 2 comprises only one layer 41, additional layers may be created, depending on the interconnection requirements of the semiconductor dice 10 and 20. Thus, the flexible member 40 may include further layers in addition to the first layer 41 shown in FIG. 2. These further layers may be of the same material as the first layer 41, or may comprise different flexible materials.

Figure 3:
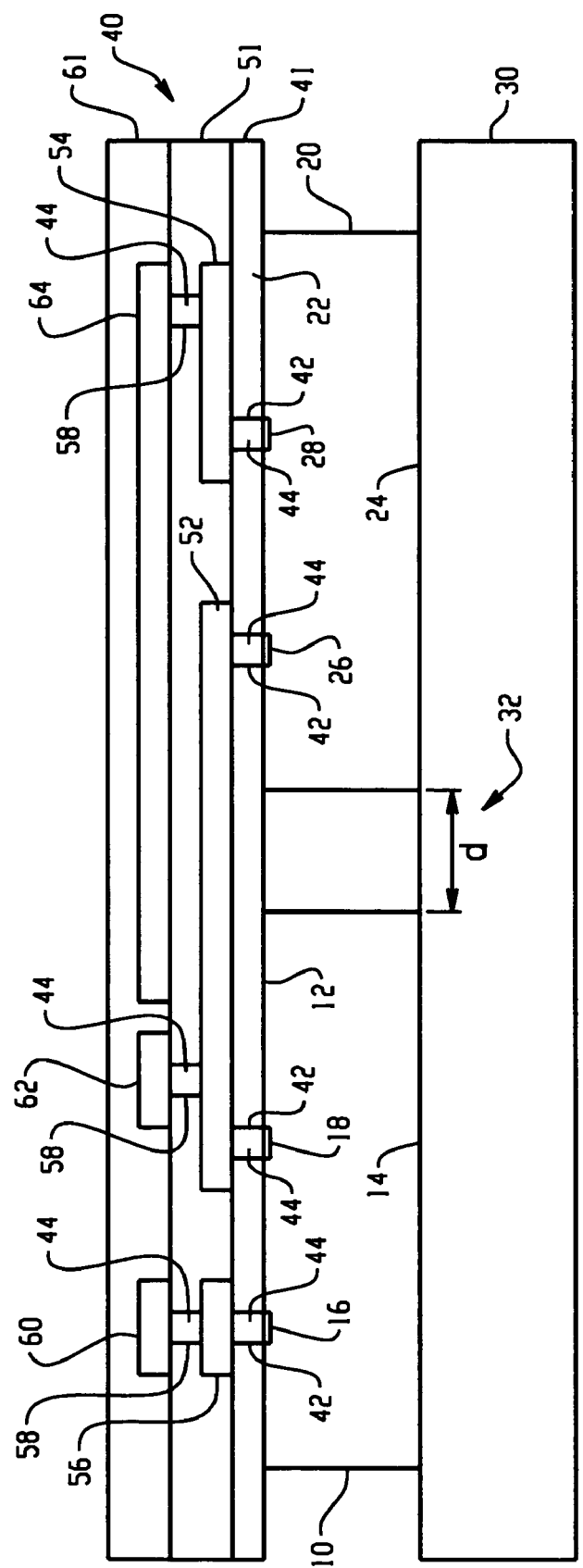
FIG. 3 is a cross sectional view of the semiconductor dice during an intermediate step of creating the flexible thin film electrical interconnections over the semiconductor dice.

FIG. 3 is a cross section view of the semiconductor dice 10 and 20 during an intermediate step of creating flexible electrical interconnections in the flexible member 40. In FIG. 3, the flexible member 40 comprises three dielectric layers 41, 51 and 61. In the embodiment shown in FIG. 3, the flexible member 40 is a thin film interconnect structure with polyimide dielectric and Copper or Aluminum conductors.

After the first layer 41 of the flexible member 40 has been created, vias 42 from the top surface of the first layer 41 down to the die pads 16, 18, 26 and 28 are created. Typically, a photolithography process may be used to create the vias 42. Other processing methods may also be used to create the vias 42.

A blanket deposition may then be used to deposit a conductive layer over the top surface of the first layer 41 of the flexible member 40. The blanket deposition may be applied by physical deposition techniques such as evaporation, sputtering, plating or by chemical deposition techniques such as chemical vapor deposition (CVD). The conductive layer may comprise a metal such as copper, gold, platinum, or other such conductive metal. In addition to conductive metals, other interconnect materials may also be used.

The blanket deposition deposits the conductive material 44 within the vias 42 and on the top surface of the first layer 41 of the flexible member 40. A patterning process selectively removes deposited portions of the conductive material 44 from the top surface of the first layer 41 of the flexible member 40 to form electrical conductor routes that interconnect the semiconductor dice 10 and 20. As shown in FIG. 3, the patterning process removes portions of the conductive material 44 from the top surface of the first layer 41 to form electrical interconnections 52, 54 and 56. Illustratively, electrical interconnection 52 electrically connects die pads 18 and 26, and electrical interconnections 54 and 56 form traces for electrically connecting the die pads 16 and 28 to an adjacent upper layer.

After the patterning step is complete, a second layer 51 of the flexible member is deposited. The second layer 51 may comprise the same material as the first layer 41, or may comprise a different flexible material. The second layer 51 may be deposited by known methods, such as by a spin-on application. Other deposition methods may also be used to create the second layer 51.

The dielectric deposition, via fabrication, conductor deposition and interconnect patterning processes are then repeated to form additional electrical interconnection for the second layer 51 of the flexible member 40. As shown in FIG. 3, the second layer 51 of the flexible member 40 includes vias 58 at selective locations, and each via 58 has deposited therein the conductive material 44. Bonding pads 60 and 62 and trace 64 are formed to provide electrical interconnections to the top surface of an adjacent upper layer 61. Illustratively, the upper layer 61 of the flexible member 40 is the final passivation layer.

While only electrical interconnections are shown, thin film passive elements, such as resistors or capacitors, may also be included in one or more layers of the flexible member 40. Typically, the passive elements will be located in regions of flexible member 40 above the top surfaces 12 and 22 of the semiconductor dice 10 and 20, and not above the die gap 32. This is because the passive components may not be as flexible as the conductive material 44 or the flexible member 40, therefore placing the passive elements in an area of the flexible member 40 that will not be bent helps prevent damage to the passive elements during bending. If the curvature of the flexible member 40 after the bending process is such that a passive element will not be damaged and also be able to operate normally, however, then the passive element may be located in a region of the flexible member 40 above the die gap 32.

Figure 4:
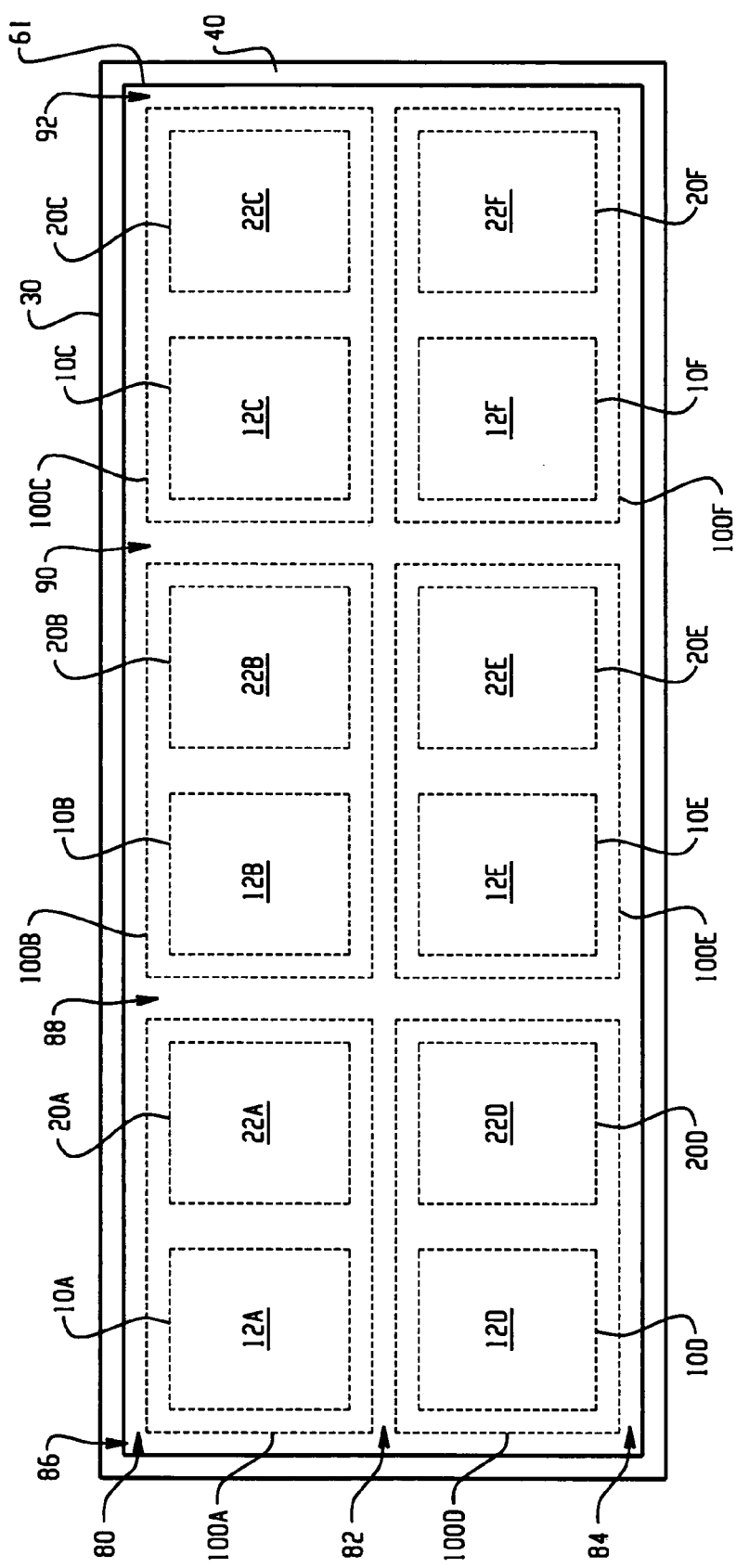
FIG. 4 is a top view of a plurality of semiconductor dice sets after the flexible interconnections in the thin film have been created, but without the individual routes shown for clarity.

After all required electrical interconnections have been created in the flexible member 40, the plurality of semiconductor dice are singulated. FIG. 4 is a top view of a plurality of semiconductor dice after the flexible interconnections in the flexible member 40 are created. As shown in FIG. 4, a plurality of sets of semiconductor dice 100A, 10B, 100C, 100D, 100E, 100F may be processed on each substrate. Each set of semiconductor dice 100 includes corresponding dice 10 and 20. The flexible member 40 extends across the planar surface defined by the top sides 12 and 22 of the semiconductor dice 10 and 20, and the upper level 61 of the flexible member 40 defines the top surface of the flexible member 40.

An exemplary singulation process includes the steps of etching the flexible member 40 and removing the substrate 30. Etching the flexible member 40 removes the flexible member 40 within dicing streets 80, 82, 84, 86, 88, 90, and 92. The etching process illustratively includes the steps of depositing a hardmask on the top surface of the flexible member 40, patterning the hardmask with a photoresist according to the dicing streets 80, 82, 84, 86, 88, 90, and 92, and then etching to remove the flexible member 40 in the area defined by the dicing streets 80, 82, 84, 86, 88, 90, and 92. Vias 72 are also created in the final passivation layer 61 to open the newly formed bond pads located above the top surface 12 of the semiconductor die 10.

While the dicing streets 80, 82, 84, 86, 88, 90 and 92 shown in FIG. 4 are straight, angled dicing streets may also be used to facilitate different multi-die modules. For example, semiconductor dice 10A, 20A, and 10D may form a first semiconductor dice set; semiconductor dice 20D, 10E, and 10B a second semiconductor dice set; semiconductor dice 20B, 20E, and 10F a third semiconductor dice set; and semiconductor dice 10C, 20C and 20F a fourth semiconductor dice set. Angled dicing streets may then be selected accordingly to remove the flexible member 40 between the respective first, second, third and fourth semiconductor dice sets.

Figure 5A:
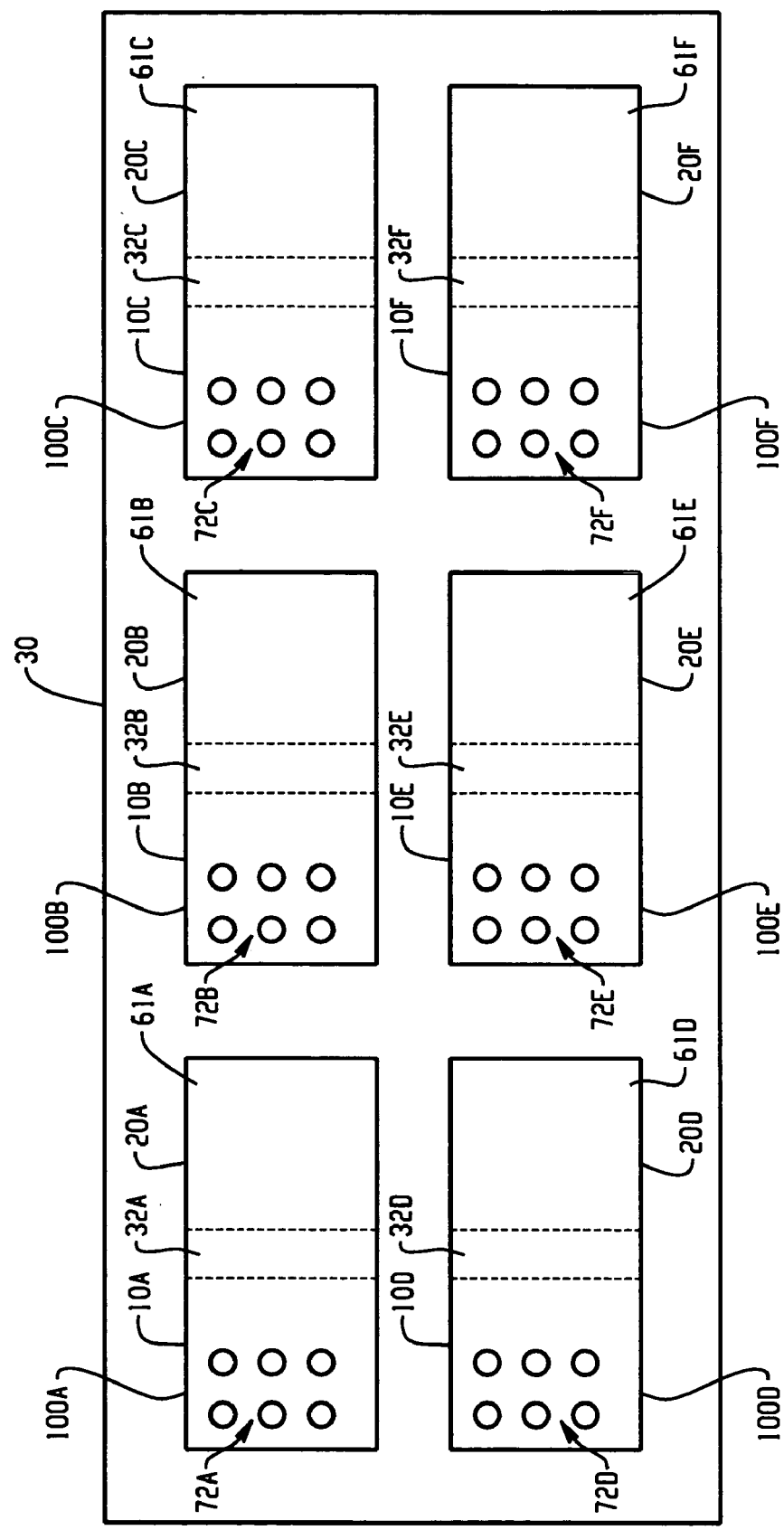
FIG. 5A is a top view of the plurality of semiconductor dice after the flexible member has been separated to form adjacent corresponding sets.
Figure 5B:
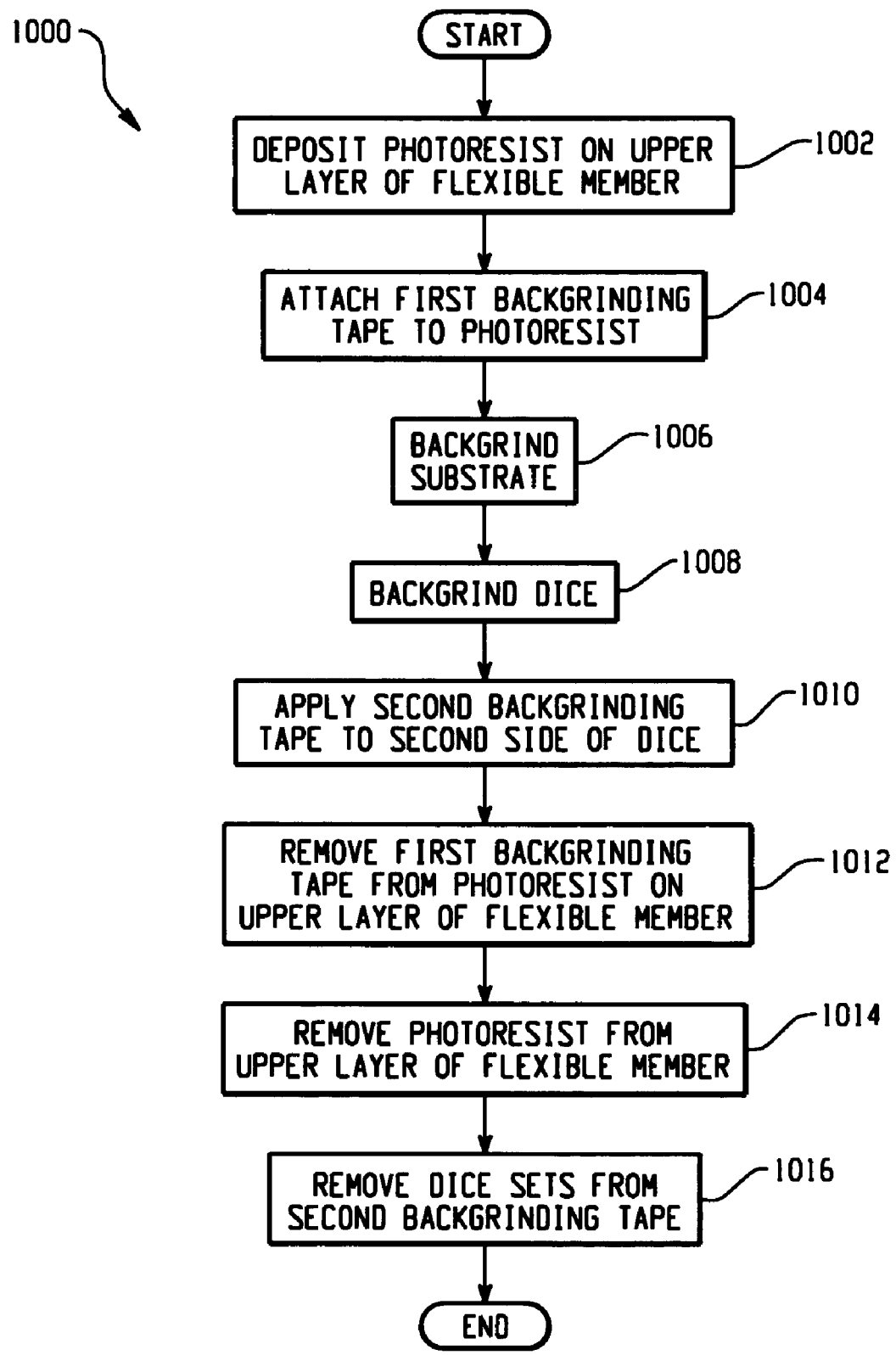
FIG. 5B is a flow diagram illustrating the steps of removing the semiconductor dice from the substrate.

FIG. 5A is a top view of the plurality of semiconductor dice after the flexible member 40 has been removed from the dicing streets 80, 82, 84, 86, 88, 90, and 92 between the corresponding sets of dice 100 and after the vias 72 have been created. The substrate 30 is now ready to be removed. This can be accomplished by backgrinding, laser ablation or another release process. The preferred method is by backgrinding which is shown in FIG. 5B as a flow diagram 1000 illustrating the steps of removing the substrate 30 from the semiconductor dice 10 and 20. In step 1002, a photoresist is deposited on the upper layer 61 of the flexible member 40. The photoresist protects the upper layer 61 of the flexible member 40 from a first backgrinding tape that is attached to the photoresist in step 1004.

After the first backgrinding tape is attached, the substrate 30 is removed by backgrinding, as shown in step 1006. In step 1008, the dice may also be thinned by continuing the backgrinding operation. Typically, the active layer on the top surfaces 12 and 22 of the semiconductor dice 10 and 20 is less than 10 microns deep; accordingly, the semiconductor dice 10 and 20 may be further thinned to reduce their overall thickness.

After the semiconductor dice 10 and 20 have been thinned, or, alternatively, after the substrate 30 has been removed, a second backgrinding tape is attached to the bottom sides of the semiconductor dice 10 in step 1010, and the first backgrinding tape is then removed in step 1012. In one embodiment, the second backgrinding tape is of a different type of backgrinding tape than the first backgrinding tape to facilitate different backgrinding tape removal processes. For example, the first backgrinding tape may be an UV-backgrinding tape and the second backgrinding tape may be a non-UV backgrinding tape. Thus, the first backgrinding tape may be removed by UV exposure in step 1012 without affecting the adhesive properties of the second backgrinding tape.

In step 1014, the photoresist is removed from the upper layer 61 of the flexible member 40. The semiconductor dice sets 100 may then be removed from the second backgrinding tape, as shown in step 1016.

Other methods may also be used to remove the substrate 30. For example, laser ablation or etching may be used to remove the substrate 30 from the semiconductor dice 10 and 20.

Figure 6:
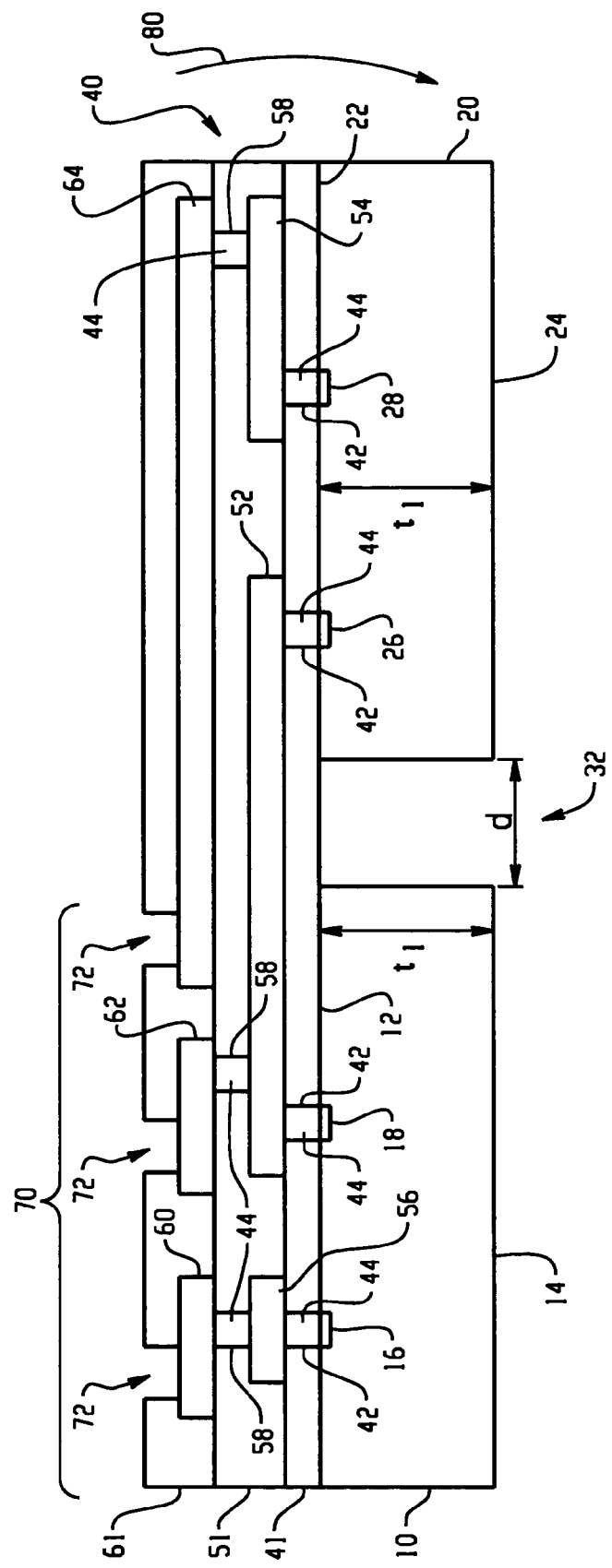
FIG. 6 is a cross sectional view of the semiconductor dice and the completed flexible thin film interconnects after singulation.

FIG. 6 is a cross section view of the semiconductor dice 10 and 20 and the completed flexible member 40 after singulation. Each die 10 and 20 has been thinned to a thickness $t_1$. Additionally, vias 72 define a new pad layer 70 that includes the bond pads 60, 62 and 64 above the first surface 12 of semiconductor die 10. FIG. 6 shows the thin film interconnect aligned with the die edge, however the singulation process could be adjusted to allow the thin film to extend beyond the left edge of die 10 or the right edge of die 20 or any unused side to further facilitate subsequent assembly processes or it could alternatively be etched back to reside within the perimeter of the die edges of 10 and 20. The bond pad 64 is illustratively a redistributed bond pad for the bond pad 54 of the semiconductor die 20. By redistributing the bond pads of the semiconductor die 20, all electrical interconnections for both semiconductor dice 10 can be located in the pad layer 70 above die 10.

The die gap 32 defines a bending region at which the flexible member 40 may be folded in a direction indicated by arrow 80 so that the bottom surface 24 of the semiconductor die 20 is juxtaposed to the bottom surface 14 of the semiconductor die 10. By folding the flexible member 40 at this bending region, a multidimensional interconnected structure may be fabricated.

Figure 7:
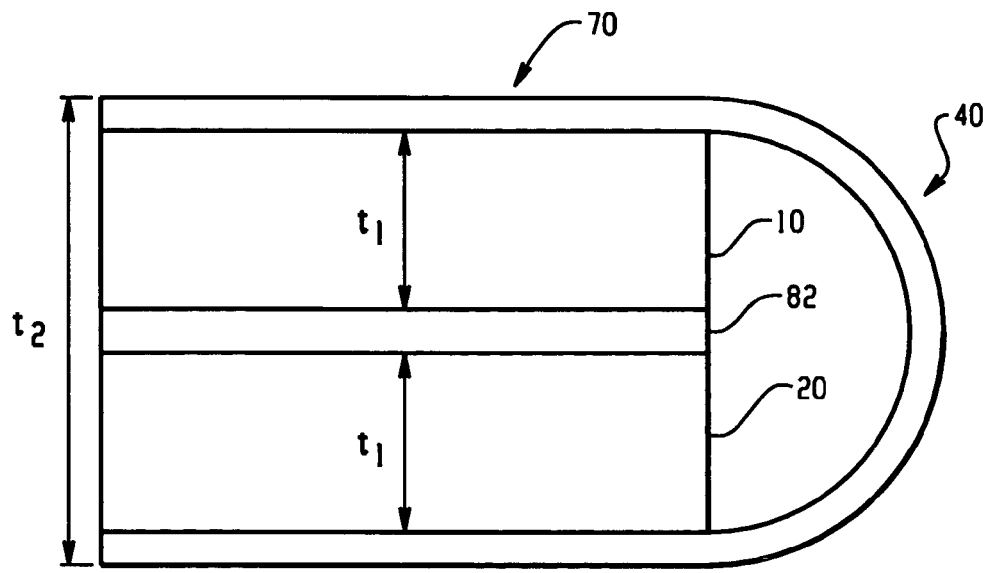
FIG. 7 is a cross section view of the semiconductor dice after the flexible member has been folded to form a vertically stacked plurality of semiconductor dice.

FIG. 6 as shown is not to scale; the thickness of the semiconductor dice 10 and 20 and the thickness of the flexible member 40 have been exaggerated to illustrate relevant detail. FIG. 7, is a cross section view of the semiconductor dice 10 and 20 after the flexible member 40 has been folded to form a stacked plurality of semiconductor dice. An adhesive 82, which may be thermally conductive, may be used to bond the bottom surface 24 of the semiconductor die 20 to the bottom surface 14 of the semiconductor die 10 or a heat spreader could be inserted to allow better cooling of the integrated circuit assembly.

Thinning the stacked plurality of semiconductor dice 10 and 20 reduces the overall stack thickness of the final assembly of vertically interconnected semiconductor dice. For example, the overall stack thickness $t_2$ of the stacked plurality of semiconductor dice 10 and 20 of FIG. 7 may be on the order of 250 microns. In one embodiment, the flexible member 40 is a thin film interconnect comprising polyimide dielectric layers and copper interconnections. The polyimide layers are approximately 1–10 microns thick, and the copper interconnections are approximately 1–5 microns thick and 10 microns wide on a 25 micron pitch. Vias are approximately 10–30 microns in diameter. This is a key aspect of this invention since it allows high density interconnections to be formed using a standard integrated circuit equipment set that are also very reliable since they were formed by a build up process instead of creating another assembly interface.

The pad layer 70 defines a connection interface surface for a stacked plurality of semiconductor dice formed by folding the flexible member at the die gap 32. The completed stack may now be implemented as a component in an electronic assembly. Typically, the pad layer 70 may be fabricated to be compatible with any desired packaging process to stay within the industry infrastructure, such as wire bonding, tab bonding, uBGA attachment, or flip chip attachment. For example, redistribution of the bond pads so that all the bond pads are located in the pad layer 70 allows for direct connection of the completed assembly to a lead frame to eliminate wire bonds, or they can be used to facilitate an area array connection.

Variations and modification of the exemplary methods and embodiments described with reference to FIGS. 1–7 exist. For example, more than two semiconductor dice may be connected by a flexible member and folded accordingly. Additionally, another pad layer may be used to attach additional circuitry to the completed assembly of stacked plurality of semiconductor dice. Also, the semiconductor dice 10 and 20 may first be thinned before attaching them to the substrate 30.

Figure 8:
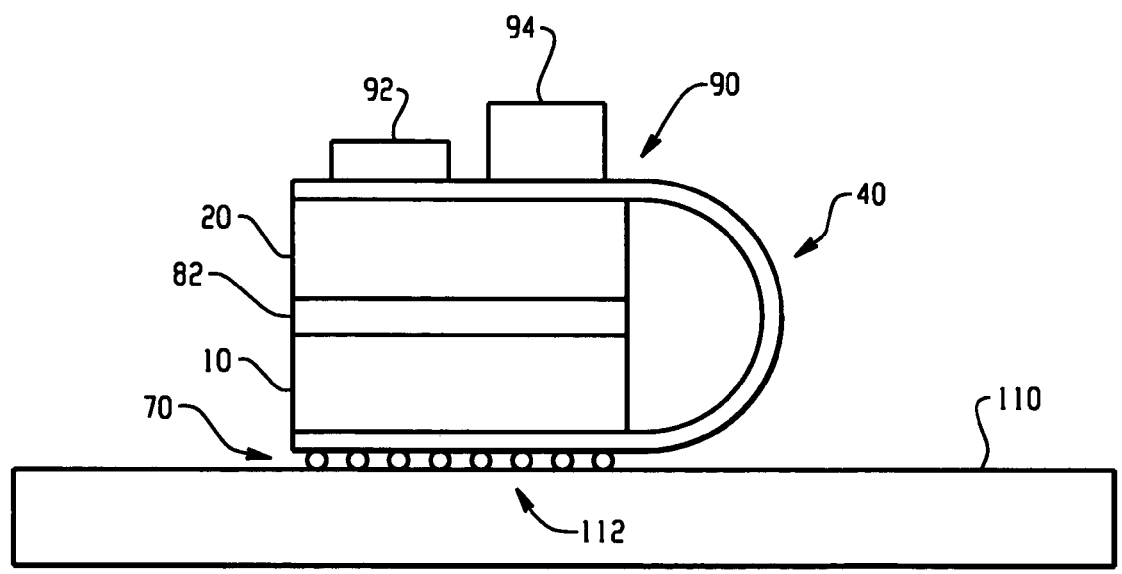
FIG. 8 is a cross section view of the stacked plurality of semiconductor dice utilized in a flip chip assembly.

FIG. 8 is a cross section view of the stacked plurality of semiconductor dice 10 and 20 utilized in a flip chip assembly process. In this embodiment, the flexible member 40 defines two pad areas 70 and 90. The first pad area 70 is compatible with a conventional flip chip assembly process. Solder balls 112 are used to electrically connect the stacked plurality of semiconductor dice 10 and 20 to an interconnect substrate 110 according to known flip chip assembly methods.

The second pad area 90 is used to electrically connect additional circuitry 92 and 94 to the stacked plurality of semiconductor dice 10 and 20. The additional circuitry 92 and 94 may range from discrete passive components to additional semiconductor devices. For example, additional circuitry 92 may be an inductor, and additional circuitry 94 may be a random access memory (RAM) device.

Figure 9:
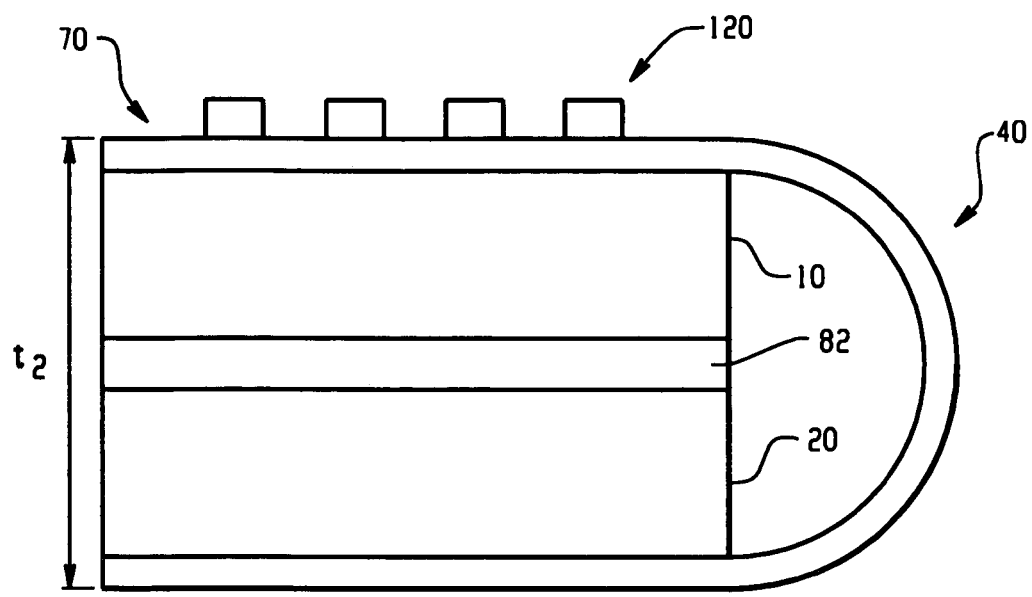
FIG. 9 is a cross section view of a stacked plurality of semiconductor dice configured to fit into a standard Thin Small-Outline Package (TSOP) package.

The semiconductor die 10 and 20 and flexible member 40 may be configured to fit in standard packaging assemblies, such as a Thin Small Outline Package (TSOP) package, for example. FIG. 9 is a cross section view of a stacked plurality of semiconductor dice 10 and 20 configured to fit into a standard TSOP package that is normally used for a monolithic die. In a TSOP Type I package, for example, the stacked plurality of semiconductor dice 10 and 12 are configured to fit within a package having a maximum thickness of about 1 mm, a maximum length of about 20 mm, and a maximum width of about 10 mm. The wire bond pads 120 are distributed to accommodate connections to TSOP package leads.

Figure 10:
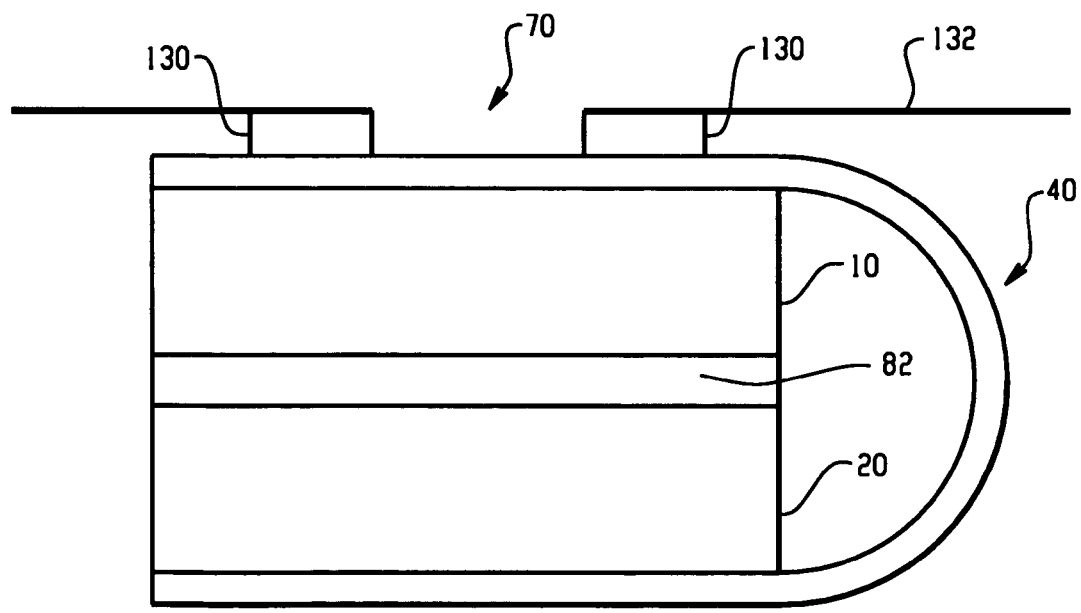
FIG. 10 is a cross section view of the plurality of stack semiconductor dice 10 and 20 configured for a leadframe attachment for the TSOP format.

Other packaging standards and methods may also be facilitated by corresponding configuration of the pad layer 70. For example, FIG. 10 is a cross section view of the plurality of stacked semiconductor dice 10 and 20 configured to be used in a leadframe attachment. Bond pads 130 are staggered and redistributed so that a leadframe 132 can be attached directly to the bond pads 130.

Figure 11A:
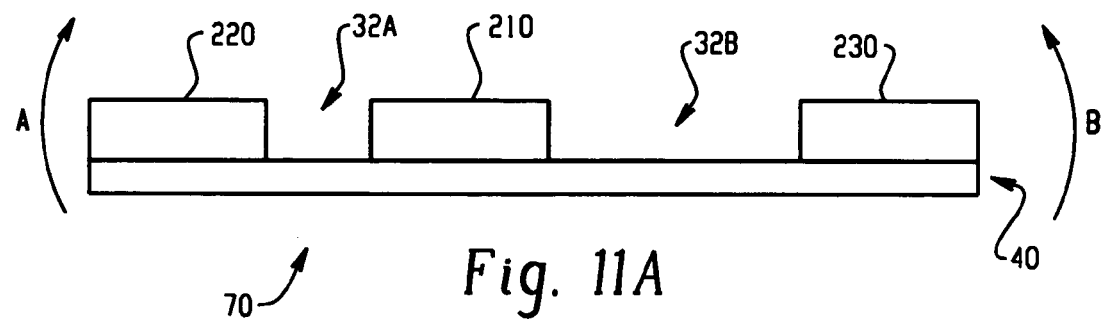
FIGS. 11A and 11B are cross section views illustrating a folding process for folding three dice into a vertical three-die stack.
Figure 11B:
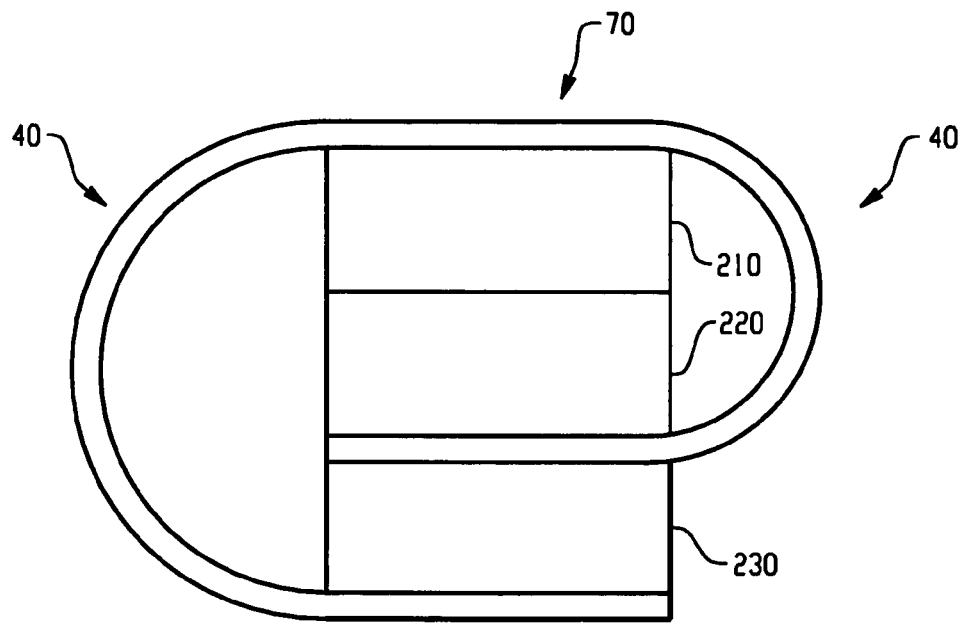

FIGS. 11A and 11B are cross section views of three dice 210, 220 and 230 arranged in a three-die stack. As shown in FIG. 11A, the dice 210, 220 and 230 are adjacently disposed so that the die gaps 32A and 32B are spaced to accommodate a first folding of the flexible member 40 at the die gap 32A in the direction of the first arrow A and followed by a second folding of the flexible member 40 at the die gap 32B in the direction of the second arrow B. The first folding of the flexible member 40 at the die gap 32A places the second sides of the dice 210 and 220 in juxtaposition, and the second folding of the flexible member 40 at the die gap 32B places the bottom side of the die 230 in juxtaposition to the bottom side of the die 220. The completed assembly is depicted in FIG. 11B. It should be noted that in all of the drawings the die are shown for illustrative purposes to be much thicker, but are actually only 100 to 500 microns thick.

Figure 12A:
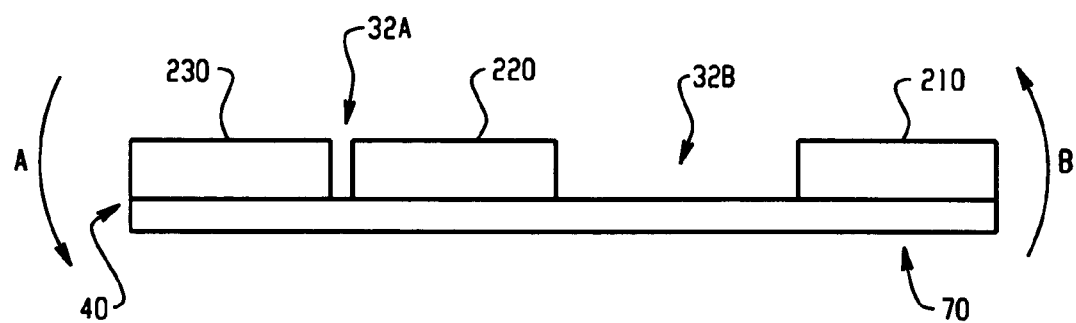
FIGS. 12A and 12B are cross section views illustrating a folding process for folding three dice in a second three-die stack.
Figure 12B:
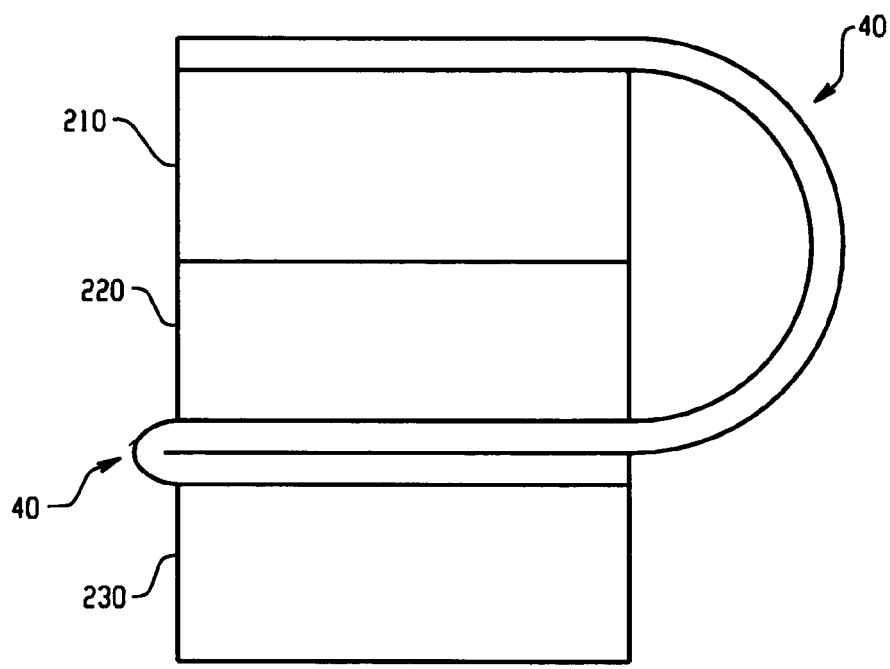

FIGS. 12A and 12B illustrate a similar folding process and completed assembly as depicted in FIGS. 11A and 11B, except that the flexible member 40 is folded at the die gap 32A so that the bottom sides of the dice 220 and 230 are placed in juxtaposition. The die gap 32A of FIG. 12A may be relatively small, or the semiconductor dice 220 and 230 may be even abutted, since only the top sides of the dice 220 and 230 (e.g., the die surfaces having the flexible member attached thereto in FIGS. 12A and 12B) are to be juxtaposed. In the instance where the semiconductor dice 220 and 230 are abutted, the folding region is defined by the flexible member at the abutted edges of the semiconductor dice 220 and 230. This configuration provides for capacitive coupling of the interconnect pads from die 220 and die 230.

Figure 13A:
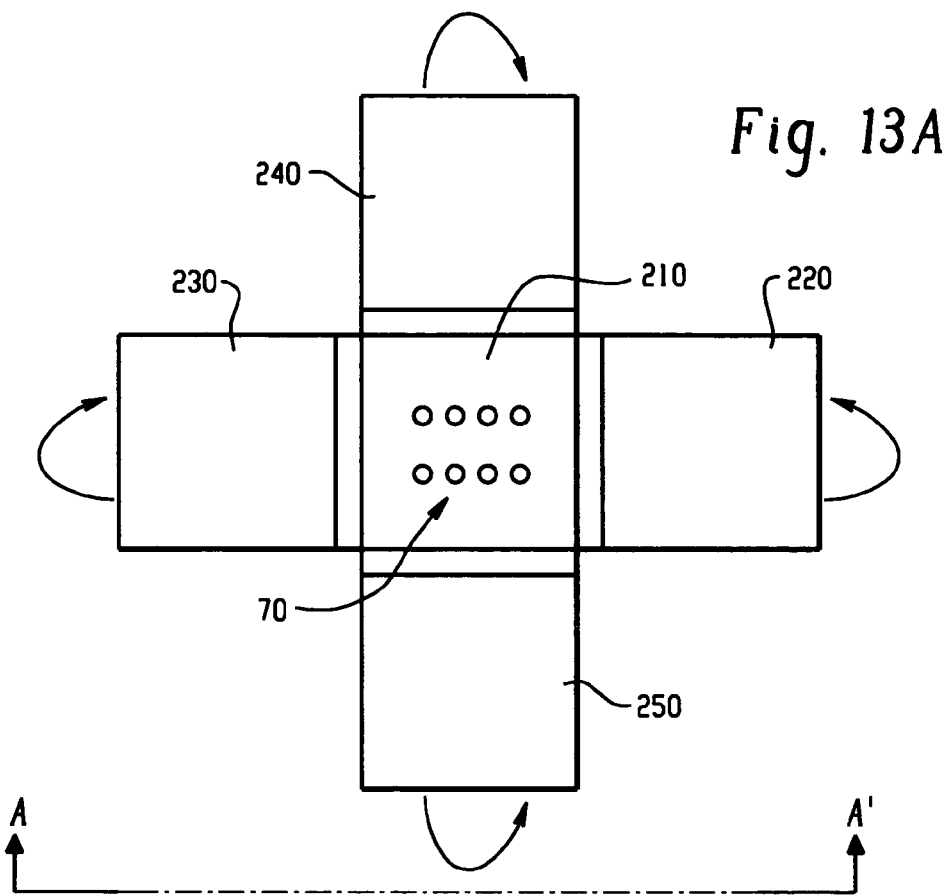
FIG. 13A is cross section views of five dice to be arranged in a five-die configuration.
Figure 13B:
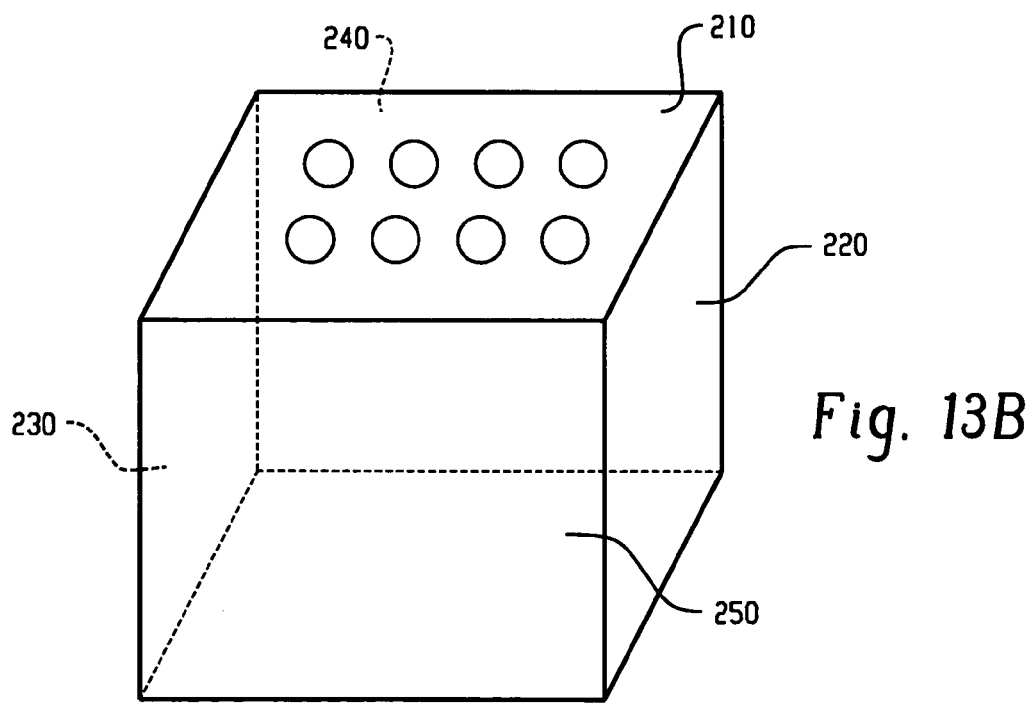
FIG. 13B is an isometric view of a five-die configuration defining a geometric shape.

FIG. 13A is a cross section view of five dice 210, 220, 230, 240 and 250 to be arranged in a five-dice configuration. In one embodiment, the five dice 210, 220, 230, 240 and 250 may be bent to define a multidimensional geometric volume, such as a boxed structure, as shown in FIG. 13B or completely folded to create a five die stack as shown in FIG. 13 C. In this embodiment, the thinning of the semiconductor dice 210, 220, 230, 240 and 250 may be omitted to increase the strength of each die. Alternatively, each die 210, 220, 230, 240 and 250 may be attached to the respective side of a cube structure. The cube structure may comprise insulating material in the form of a cube, or may comprise a cube frame or housing having surfaces configured to receive respective die 210, 220, 230, 240 and 250. The cube frame or housing may be further configured to provide additional functionality, such as needed for heat dissipation, or to efficiently incorporate dice sensors in an orthogonal arrangement to measure parameters in the x, y and z axis.

Figure 13C:
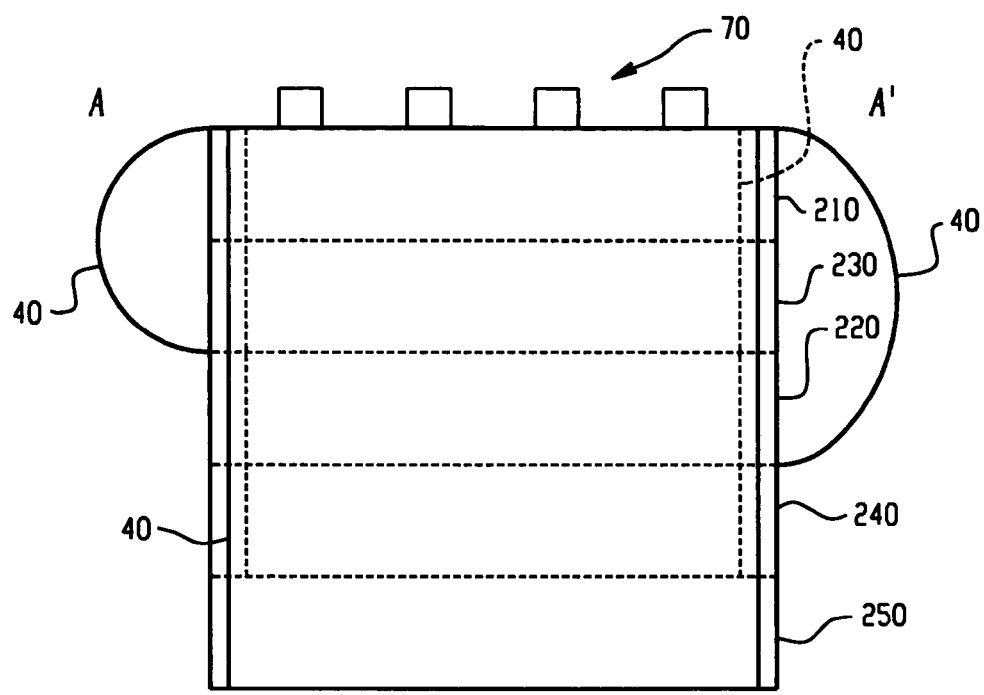
FIG. 13C is a cross section view of a five-die stack.

In another embodiment, the die gaps between the five dice 210, 220, 230, 240 and 250 are adjusted to accommodate folding the five dice 210, 220, 230, 240 and 250 into a stacked assembly, as shown in FIG. 13C.

FIG. 13C illustrates that as the number of dice to be integrated into a stacked assembly increases, the length of the die gaps between particular die pairs increases. The increased length of the die gaps increases signal latency, attenuation and reduces the number of loads allowed on each signal net.

Figure 14:
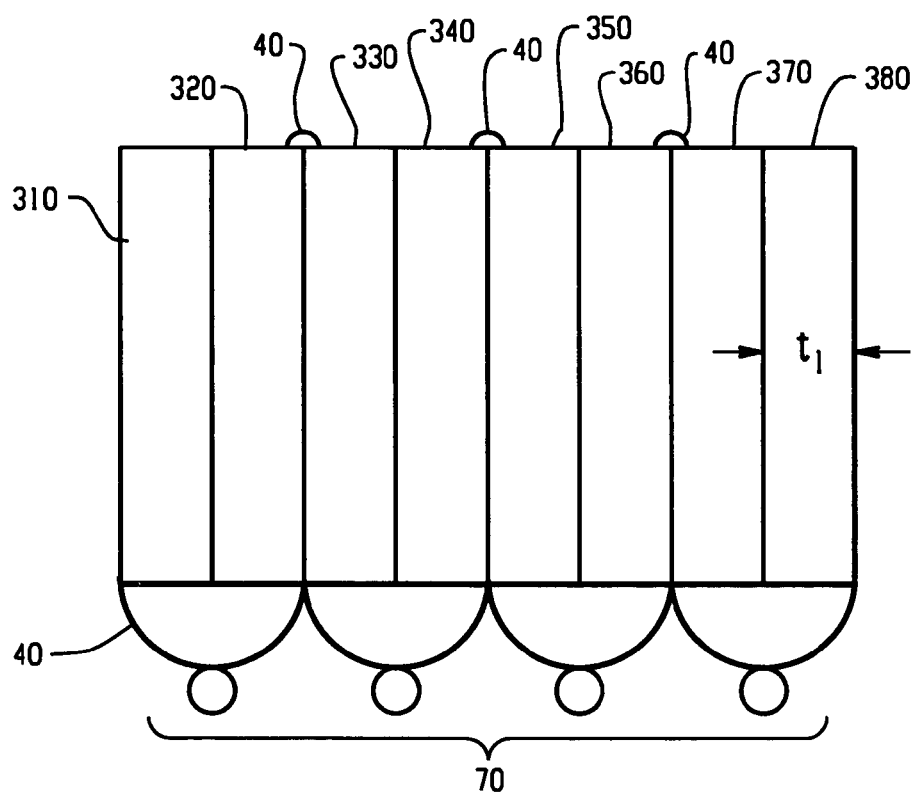
FIG. 14 is a cross section view of an eight-die stack.

One approach to limit these parasitics and to achieve access independently to each die pad is to fold the flexible member 40 at the die gaps so that the dice define a geometric volume, as shown in FIG. 13B. Another approach to limit this latency is to define pad layers in the folded sections of the flexible material, as shown in the embodiment of FIG. 14. Eight semiconductor dice 310, 320, 330, 340, 350, 360, 370 and 380 are folded as shown to form an eight-die stack. The thickness $t_1$ of each die is selected so that curvature of the flexible member 40 folded in the regions defined by the die pairs 310 and 320, 330 and 340, 350 and 360, and 370 and 380 is made to facilitate distribution of the pad layer 70 along the outer curvatures of the folded regions of the flexible material 40.

To further decrease the curvature of the folded regions of the flexible material 40, spacing material may be inserted between the juxtaposed bottom sides of the die pairs 310 and 320, 330 and 340, 350 and 360, and 370 and 380. The spacing material may be, for example, an insulating material, or may alternatively be a material to facilitate cooling of the semiconductor dice. Also, because the pad layer 70 connections are decoupled from the semiconductor dice 310, 320, 330, 340, 350, 360, 370 and 380, a substrate with a different CTE may be used as the next level interconnection substrate. The connections from semiconductor die 310 and 320 can be severed by etching to leave conductor leads which overhang the die edge to facilitate the next level of interconnect.

Figure 15A:
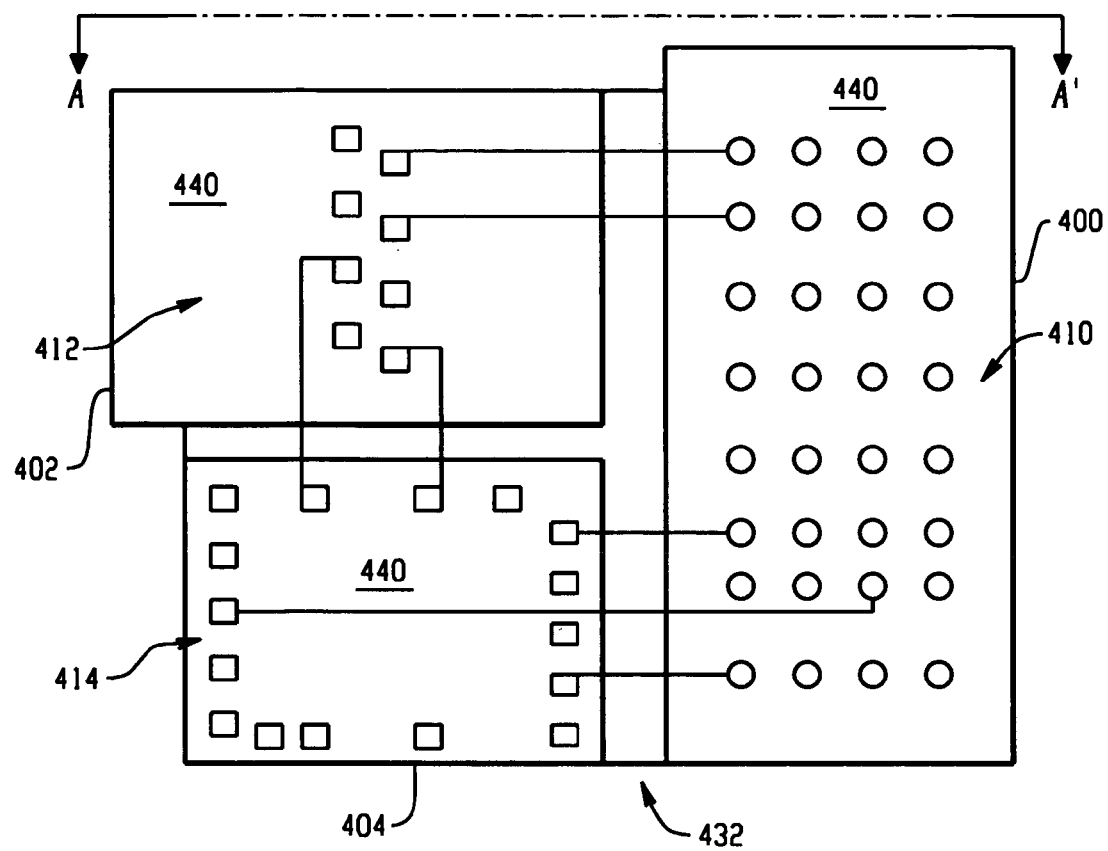
FIGS. 15A and 15B illustrate a first folding process for a microprocessor, a random access memory (RAM), and a nonvolatile memory.
Figure 15B:
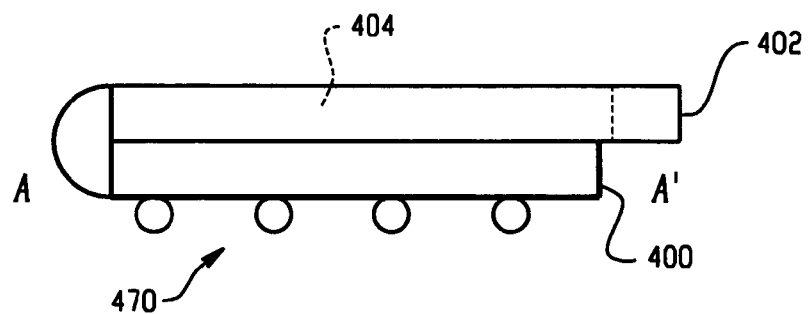

Although the dice shown in FIGS. 1–14 are illustratively of the same dimension and folded in a single overlapping manner or bent into a geometric volume, different types of dice may also be used. FIGS. 15A and 15B illustrate a folding process for microprocessor 400, a RAM 402, and a nonvolatile memory 404. Each die 400, 402 and 404 is a different dimension, and each bare die has a different bond pad scheme. For example, the processor 400 comprises an area array pad 410; the RAM 402 comprises a centerline pad 412; and the nonvolatile memory 404 comprises a perimeter pad. A flexible member 440, such as a thin film interconnect, may be deposited on the top sides of the dice 400, 402 and 404 to electrically connect the dice 400, 402 and 404 as shown.

Illustratively, the die with the largest footprint may be used to define a pad area 470. Alternatively, a die with a smaller footprint may be used to define a pad area 470, depending on the area required for external connections. The flexible member 440 is folded at a die gap 432, creating a stacked plurality of semiconductor dice as shown in FIG. 15B. In this embodiment, the bottom sides of the dice 402 and 404 are juxtaposed to the bottom side of the die 400. Also, while the die 400 has the largest footprint, dice 402 and 404 are larger in width and extend over one side of the die 400, as shown in FIG. 15B.

Figure 16A:
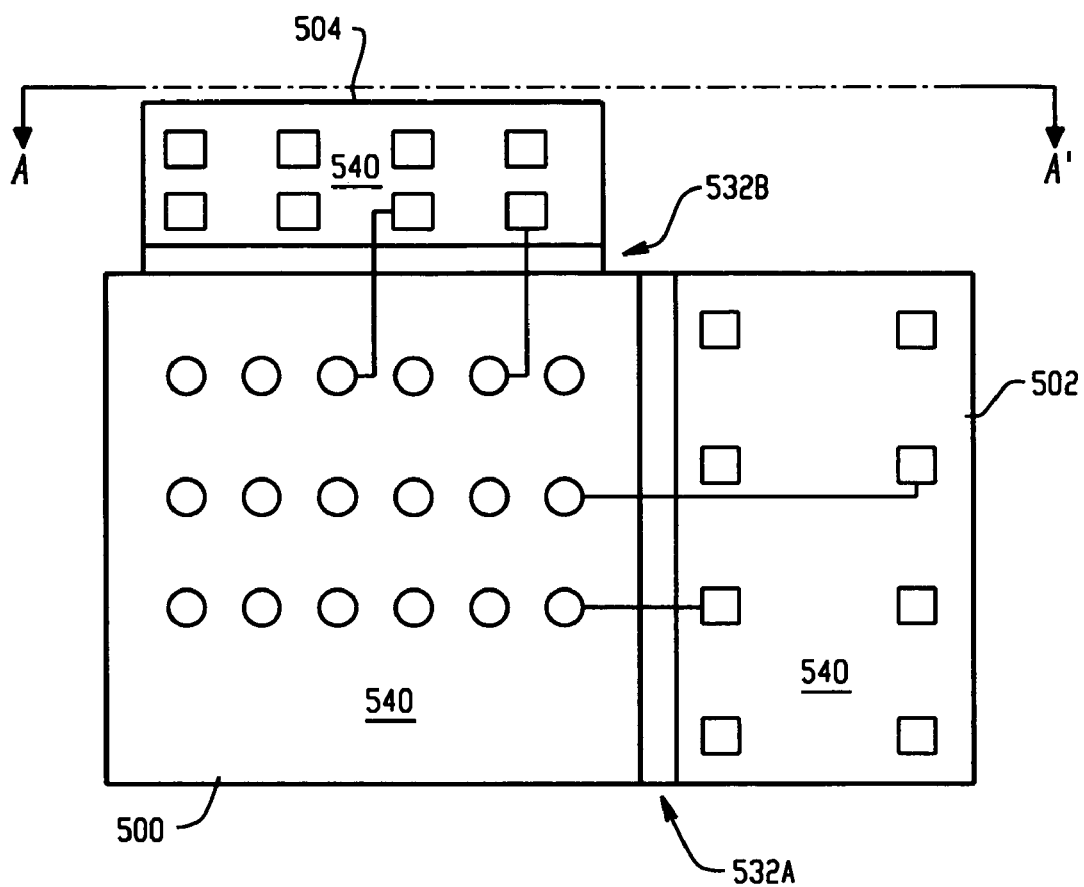
FIGS. 16A and 16B illustrate a second folding process for the microprocessor, the RAM, and the nonvolatile memory.
Figure 16B:
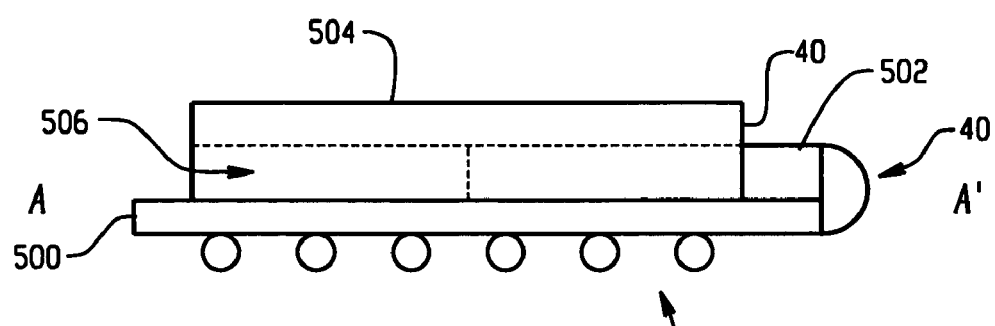

The dice need not completely overlap when folded. FIGS. 16A and 16B illustrate a folding process for a microprocessor 500, a RAM 502, and a nonvolatile memory 504. The process and assembly are similar to that of FIGS. 15A and 15B, except that the flexible member 540 is first folded at the die gap 532A, followed by a second folding at the die gap 532B. A cross section view of the completed assembly is shown in FIG. 16B. As shown in FIG. 16B, the bottom sides of the dice 500 and 502 are juxtaposed, and the top side of the die 502 and the bottom side of the die 504 are juxtaposed. The die 504 does not completely overlap the die 502, and thus a space 506 is defined by the offset second sides of the dice 500 and 504.

Figure 17:
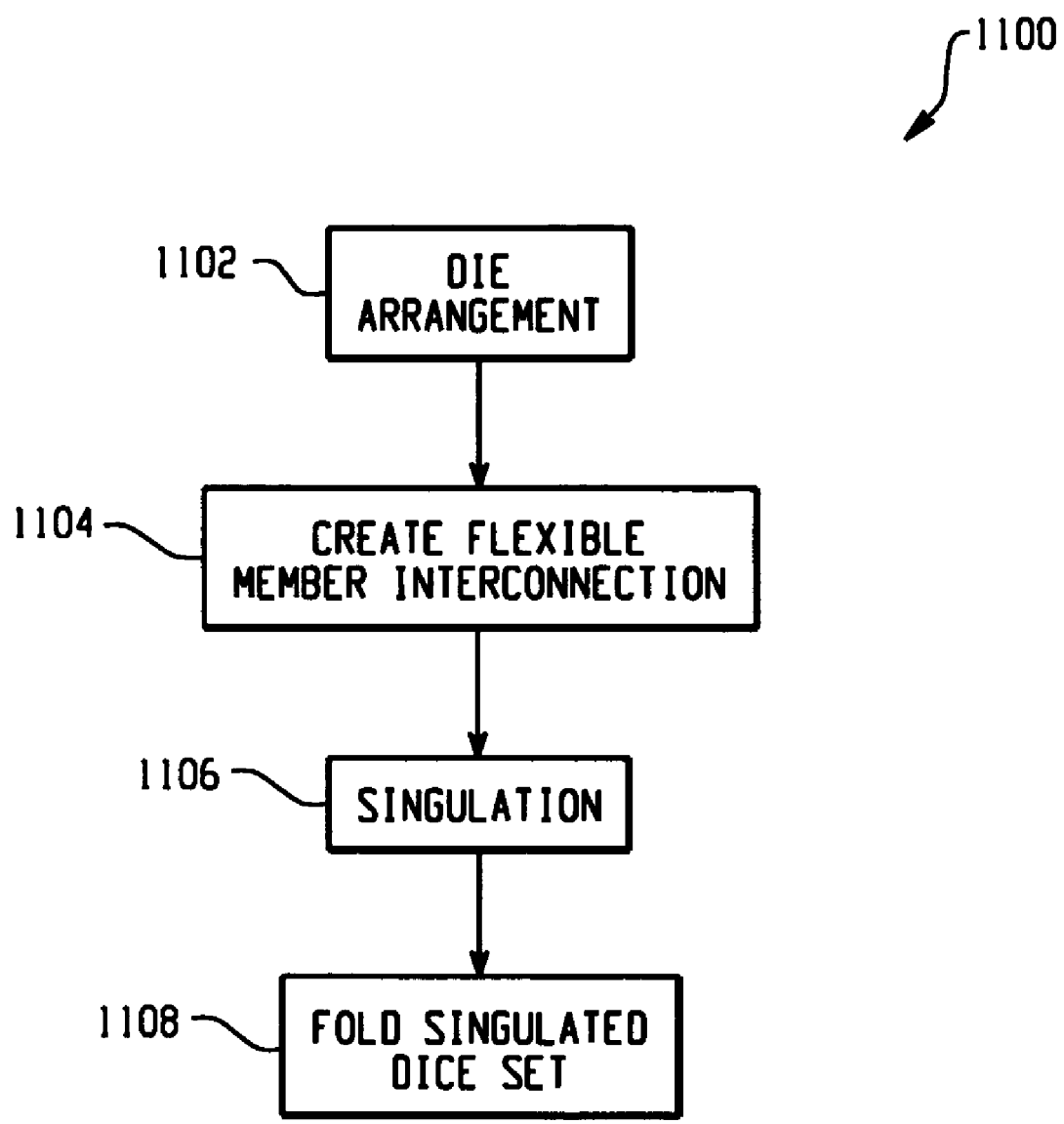
FIG. 17 is a flow diagram illustrating an exemplary process of creating a multidimensional interconnected dice structure.

FIG. 17 is a flow diagram 1100 illustrating an exemplary process of creating a multidimensional interconnected dice structure. In step 1102, the semiconductor dice are placed and bonded on a substrate using a pattern recognition application along with a precise x-y table to achieve a registration of better than 10 microns so that the semiconductor dice are in an adjacent disposition and define one or more bending regions. The dice that are to comprise a semiconductor dice set to be bent are adjacently disposed, and the die gaps between the dice are spaced to facilitate bending at the die gap region. For example, if the three-die stack of FIG. 11B is to be fabricated, then the semiconductor dice are arranged to define the die gaps 32A and 32B of FIG. 11A. Likewise, if the three-die stack of FIG. 12B is to be fabricated, then the semiconductor dice are arranged to define the die gaps 32A and 32B of FIG. 12A. The die gap 32A of FIG. 12A may be relatively small, or the semiconductor dice 220 and 230 may be even abutted, since only the top sides of the dice 220 and 230 (e.g., the die surfaces having the flexible member attached thereto in FIGS. 12A and 12B) are to be juxtaposed.

In step 1104, the flexible member and interconnections are created to interconnect the semiconductor dice. The first step is to laminate the initial dielectric film which is layer 41 in FIG. 2. This film is then patterned to create vias which allow access to the die pads for die 10 and 20. The additional flexible interconnects may then be created by utilizing standard integrated circuit processing equipment, as previously described.

In step 1106, the semiconductor dice sets are singulated. This step includes the step of removing the portions of the flexible member between the respective semiconductor dice sets. The dicing streets may be straight if the semiconductor dice sets are arranged along a single axis, or may be angled accordingly if the semiconductor dice sets are arranged along two axes, as described with reference to FIG. 4 above.

The substrate is now removed from the previously attached semiconductor dice, and then the semiconductor dice are thinned as required to meet the folding requirements and the final form factor. Additionally, the semiconductor dice may also be thinned to also increase packaging density.

In step 1108, the flexible member is folded at the die gaps defined by the semiconductor dice and the bottom sides are bonded together to form a multidimensional interconnected dice structure. The multidimensional interconnected dice structure may define a geometric volume, or may define a stacked plurality of semiconductor dice. The multidimensional interconnected dice structure may then be assembled or packaged according one of many standard packaging processes.

This written description uses illustrative embodiments to disclose the invention, including the best mode, and also to enable a person of ordinary skill in the art to make and use the invention. Other embodiments are within the scope of the claims if they have elements that do not differ from the literal language of the claims, or have equivalent elements.

What is claimed is:

1. A method of fabricating integrated circuits from a plurality of semiconductor dice, each semiconductor die defining a top side and a bottom side, the method comprising:
    attaching the bottom sides of at least two of the plurality of semiconductor dice to a substrate so that at least two of the plurality of semiconductor dice are in adjacent disposition and define one or more bending regions;
    creating a planar processing area for subsequent seamless high density thin film interconnect on the top sides of at least two of the plurality of semiconductor dice and the one or more bending regions so that at least two of the plurality of semiconductor dice are electrically interconnected;
    removing the substrate from the bottom sides of at least two of the plurality of semiconductor dice wherein removing includes the step of backgrinding the substrate from the at least two semiconductor dice; and
    bending the thin film interconnect at the one or more bending regions.

2. The method of claim 1, wherein the step of attaching the bottom sides of the at least two of the plurality of semiconductor dice comprises the step of bonding the bottom sides of the at least two semiconductor dice to the substrate.

3. The method of claim 1, wherein the step of creating a planar processing area for subsequent seamless high density thin film interconnect on the top sides of the at least two of the plurality of semiconductor dice and the one or more bending regions so that at least two of the plurality of semiconductor dice are electrically interconnected comprises the step of laminating a sheet of flexible dielectric material to the top sides of the at least two of the plurality of semiconductor dice.

4. The method of claim 3, wherein the step of creating a thin film interconnect on the top sides of the at least two of the plurality of semiconductor dice and the one or more folding regions so that the at least two of the plurality of semiconductor dice are electrically interconnected further comprises the steps of:
    creating vias through the sheet of flexible material down to the top sides of at least two of the plurality of semiconductor dice;
    depositing a conductive material within the vias; and
    forming conductive interconnection routes between the vias to create a seamless interconnection interface capable of area array connections with pad pitches from 50 to 1,000 microns.

5. The method of claim 4, wherein the flexible material is a polyimide film.

6. The method of claim 1, further comprising the step of backgrinding the bottom sides of the at least two of the plurality of semiconductor dice to decrease the thickness of each of the at least two of the plurality of semiconductor dice.

7. The method of claim 6, wherein the step of bending comprises the step of folding the thin film interconnect so that the bottom sides of at least two semiconductor dice are juxtaposed and have a stack height less than 400 microns.

8. The method of claim 7, wherein the step of folding the thin film interconnect at the one or more bending regions so that the bottom sides and top sides overlap and then bonding with a thermally conductive adhesive to form a stacked plurality of semiconductor dice.

9. The method of claim 1, wherein the step of bending comprises the step of folding the thin film interconnect at the one or more bending regions so that the top sides overlap to form a stacked plurality of semiconductor dice and further comprises the step of folding the thin film interconnect so that the pad layers of the dice are capacitively coupled.

10. The method of claim 1, wherein the step of attaching the bottom sides of the at least two of the plurality of semiconductor dice to a substrate includes attachment to a cavity substrate so that the at least two of the plurality of semiconductor dice are in adjacent disposition within a large substrate pocket and define one or more bending regions, and wherein the method comprises the steps of:
    defining a set of semiconductor dice to form a stacked plurality of semiconductor dice; and
    arranging the set of semiconductor dice to minimize electrical connections in the thin film interconnect; wherein multiple sets of semiconductor dice define the plurality of semiconductor dice.

11. The method of claim 1, further comprising the step of creating a pad layer on a section of the thin film interconnect, wherein the pad layer overlays at least one of the plurality of semiconductor dice and is suitable for subsequent flip chip attachment and wire bond assembly.

12. The method of claim 11, which further comprises the step of creating another pad layer wherein the next level connection pads are placed in at least one bending region defined by a die gap and then used for subsequent electrical solder connection within the bent region of the thin film interconnect along a side of a stacked assembly formed by the at least two dice.

13. The method of claim 1 wherein at least two adjacent semiconductor dice at least partially overlap to form a stacked plurality of semiconductor dice.

14. A method of fabricating integrated circuits from a plurality of semiconductor dice, each semiconductor die defining a top side and a bottom side, the method comprising:

attaching the bottom sides of at least two of the plurality of semiconductor dice to a substrate so that at least two of the plurality of semiconductor dice are in adjacent disposition and define one or more bending regions;

creating a planar processing area for subsequent seamless high density thin film interconnect on the top sides of at least two of the plurality of semiconductor dice and the one or more bending regions so that at least two of the plurality of semiconductor dice are electrically interconnected;

removing the substrate from the bottom sides of at least two of the plurality of semiconductor dice wherein the step of removing the substrate comprises the step of performing laser ablation; and bending the thin film interconnect at the one or more bending regions.

15. A method of fabricating integrated circuits from a plurality of semiconductor dice, each semiconductor die defining a top side and a bottom side, the method comprising:

attaching the bottom sides of at least two of the plurality of semiconductor dice to a substrate so that at least two of the plurality of semiconductor dice are in adjacent disposition and define one or more bending regions;

creating a planar processing area for subsequent seamless high density thin film interconnect on the top sides of at least two of the plurality of semiconductor dice and the one or more bending regions so that at least two of the plurality of semiconductor dice are electrically interconnected;

removing the substrate from the bottom sides of at least two of the plurality of semiconductor dice;

singulating at least two of the plurality of semiconductor dice into sub-pluralities of semiconductor die by etching dielectric layers along unused sides of the dice; and bending the thin film interconnect at the one or more bending regions.

16. A method of fabricating an assembly of integrated circuits, comprising:

adjacently positioning at a substrate at least two semiconductor dice, each of the at least two semiconductor dice having a top side and a bottom side;

defining a bending region common to at least two of the plurality of semiconductor dice;

creating a flexible member on the top sides of at least two of the plurality of semiconductor dice and across the bending region;

creating flexible electrical interconnections in the flexible member to electrically connect at least two of the plurality of semiconductor dice;

backgrinding the substrate from the bottom sides of at least two of the plurality of semiconductor dice; and bending the flexible member at the bending region to form a multidimensional interconnected dice structure.

17. The method of claim 16, wherein the step of bending comprises the step of bending the flexible member at the die gap regions so that the plurality of semiconductor dice define a geometric volume.

18. The method of claim 16 wherein the step of bending at the die gap region defines an angle between two adjacent dice within a range of 0 to 360 degrees.

* * * * *